United States Patent [19]

Das et al.

[11] 4,123,724
[45] Oct. 31, 1978

[54] COMMUNICATION EQUIPMENT

[75] Inventors: Tapan K. Das; Peter H. Boyce; Graham J. Fletcher, all of Swindon, England

[73] Assignee: Plessey Handel und Investments AG, Zug, Switzerland

[21] Appl. No.: 820,731

[22] Filed: Aug. 1, 1977

[30] Foreign Application Priority Data

Aug. 4, 1976 [GB] United Kingdom ............... 32419/76

[51] Int. Cl.$^2$ ............................................. H03B 3/04
[52] U.S. Cl. ................................. 331/1 A; 325/421; 325/453; 331/25
[58] Field of Search ..................... 331/1 A, 18, 25; 325/416–423, 453

[56] References Cited

U.S. PATENT DOCUMENTS 3,949,305  4/1976  McClaskey et al. .............. 331/1 A X
4,030,045  6/1977  Clark ................................. 331/1 A Primary Examiner—Siegfried H. Grimm
Attorney, Agent, or Firm—Fleit & Jacobson

[57] ABSTRACT

A television receiver is provided comprising a variable frequency local oscillator and frequency synthesizer control means for controlling the frequency of the variable frequency local oscillator in accordance with the setting of variable divider means for effecting channel or frequency tuning of said receiver, the frequency synthesis control means comprising first divider means operable on the output of the variable frequency local oscillator, the first divider means being set to one of a plurality of division ratios under the control of fine tuning means associated therewith, variable divider means operable on the output of the first divider means, and phase/frequency comparator means for comparing the output of the variable divider means with a reference frequency and for affording a control signal to the variable frequency local oscillator for controlling its frequency.

32 Claims, 8 Drawing Figures

SIMPLIFIED DIAGRAM OF THE SYSTEM

FREQUENCY RANGE OF FINE 'UP' TUNING FOR UHF & VHF ODD CHANNELS. CHANNEL '50' IS SHOWN AS AN EXAMPLE.

FREQUENCY RANGE OF FINE 'DOWN' TUNING FOR UHF & VHF ODD CHANNELS. CHANNEL '50' IS SHOWN AS AN EXAMPLE.

FREQUENCY RANGE OF FINE 'UP' TUNING FOR VHF EVEN CHANNELS. CHANNEL '6' IS SHOW AS EXAMPLE.

FREQUENCY RANGE OF FINE 'DOWN' TUNING FOR VHF EVEN CHANNELS CHANNEL '6' IS SHOWN AS EXAMPLE.

COMMUNICATION EQUIPMENT

This invention relates to communications equipment and although applicable to both receivers and transmitters is especially applicable to television receivers. The present invention relates more specifically to a frequency synthesis control system for use in such equipment to effect channel or frequency tuning thereof.

Frequency tuning, more often referred to as channel selection in present day television receivers, can be achieved manually and/or by preset push button, touch controls etc. The stabilisation of the frequency tuning is normally achieved by means of an automatic frequency control (AFC) system in which a comparison is made between an intermediate frequency with a reference tuned circuit and an error signal derived which is used to change the frequency of the local oscillator. Receivers incorporating such an AFC system suffer from the disadvantages that the accuracy is dependent upon the initial setting up of the reference tuned circuit which anyway tends to change with time; the operation of the AFC loop depends upon the incoming signal strength so that below a threshold level the loop will not operate; there is the possibility of the loop being captured by an adjacent strong signal when attempting to hold a weak signal; and it is necessary to remove the AFC when tuning to a different frequency.

The present invention avoids the necessity of using an AFC system by utilising a digital synthesis technique for tuning the local oscillator of a television receiver. In this way very accurate tuning without any setting up is obtained; there is no dependence on signal strength; capture by strong adjacent channels is impossible; and an indication of frequency channel tuning is automatically obtained.

According to the present invention there is provided a frequency synthesis control system for communications equipment including a variable frequency oscillator the frequency of which is changed to effect channel or frequency tuning of said equipment the control system comprising, first divider means operable on the output of the variable frequency oscillator and settable to a first division ratio or a second division ratio under the control of a fine tune control signal applied to it to afford a first divided signal, variable frequency divider means operable on the first divided signal, the division ratio of which is selected in accordance with a required channel or frequency of said equipment to afford a second divided signal, reference frequency generator means for affording a reference frequency signal, and comparator means for comparing the second divided signal and the reference frequency signal and for affording a control signal to the variable frequency oscillator for controlling its frequency, fine tuning means being provided for applying the fine tuning control signal to the first divider means and for applying a further fine tuning control signal to the variable frequency divider means whereby the division ratio of both divider means are changed for effecting fine tuning of the variable frequency oscillator.

In carrying out the invention it may be arranged that the variable frequency divider means includes first programmable divider means, and memory means preferably in the form of a read only memory for selecting a division ratio of the first programmable divider means that corresponds to a required channel or frequency of said equipment, the variable frequency divider means conveniently including a further programmable divider means operable in conjunction with the first programmable divider means and to which the further fine tuning control signal from the fine tuning means is applied for controlling its operation.

In one arrangement according to the invention the further programmable divider means may take the form of multi-bit shift delay means, and in another arrangement the further programmable divider means may take the form of multi-bit counter means.

Conveniently, the comparator means may take the form of a phase-frequency comparator, and the variable frequency oscillator may be voltage controlled, the phase-frequency comparator affording a control voltage to the variable frequency oscillator for controlling its frequency. The voltage controlled variable frequency oscillator may conveniently include at least one varactor diode to which the control voltage is applied.

Advantageously it may be arranged that the first divider means includes prescaler divider means operable on the output of the variable frequency oscillator and dual modulus divider operable on the output of the prescaler divider means for affording the first divided signal.

In a preferred system according to the invention it may be arranged that the fine tuning means includes counter means operable on the output of the further programmable divider means for affording a fine tuning control signal to the first divider means for changing its division ratio, the counter means conveniently comprising a fixed counter operable under the control of a control signal applied to it and a variable counter operable under the control of a control signal applied to it, the fixed counter and the variable counter being connected effectively in series.

Conveniently the output of the variable counter may be applied to the first divider means via synchronising latch means operable in conjunction with the output of the first divider means.

In an especially preferred system according to the present invention for communications equipment including a variable frequency oscillator the frequency of which is changed to effect channel tuning of said equipment, it will be arranged that the system further comprises channel counter means operable in conjunction with the memory means for selecting a division ratio of the first programmable divider means in accordance with a required channel of said equipment.

In such a system channel select means may be provided connected to the channel counter means for selecting the required channel, the channel select means conveniently taking the form of a digital switch.

In carrying out the especially preferred system according to the invention fine counter means will be provided for affording the control signal to the variable counter, and conveniently the channel select means and the fine counter means may operate in conjunction with timing control means under the control of a 'tune' signal applied thereto.

Conveniently the timing control means derives an input thereto from the reference frequency generator means.

Conveniently the channel counter means may be provided with control means for changing the counting rate of the channel counter means, the control means being effective for providing a coarse/fine control.

Advantageously the fine counter means may take the form of an up/down counter which is provided with control inputs for causing the counter means to count up or count down, and further memory means may be provided for storing information relating to the count positions of the channel counter means and the fine counter means corresponding to a required channel.

The further memory means is preferably of non-volatile form and conveniently in the form of a metal-nitride-oxide semiconductor (MNOS) memory or a complementary metal-oxide semiconductor (CMOS) memory.

Conveniently program select means may be provided operable in conjunction with the further memory means for causing the channel counter means and the fine counter means to be set in accordance with a preselected channel, the program select means enabling one of a plurality of programs, each corresponding to a preselected channel to be selected, the further memory means being arranged to store information relating to the count positions of the channel counter means and the fine counter means for the preselected channels corresponding to the plurality of programs.

It may be arranged that the program select means comprises a program address counter operable in the further memory means for causing the information stored therein relating to the count positions of the channel counter means and the fine counter means corresponding to a selected program to be applied to the channel counter means and the fine counter means respectively.

It may also be arranged that the program select means comprises a touch tuning arrangement for effecting program selection, the touch tuning arrangement conveniently comprising a pair of touch plates for each of the programs to be selected, and latch means associated with each pair of touch plates which is caused to be operated when the pair of touch plates with which it is associated are activated, each of the latch means being effective for causing a common voltage to be applied to the program address counter to cause the information relating to a preselected channel and corresponding to a required program stored in the further memory means to be applied to the channel counter means and the fine counter means respectively, and conveniently further comprising indicator means for indicating which program has been selected.

It is especially envisaged that a system in accordance with the present invention be used in a television receiver and accordingly in accordance with an aspect of the invention there is provided a television receiver comprising a variable frequency oscillator the frequency of which is changed to effect channel or frequency tuning of said receiver and a frequency synthesis control system in accordance with the present invention.

It is also especially envisaged that a system in accordance with the present system be used in a radio receiver, and accordingly in accordance with a further aspect of the invention there is provided a radio receiver comprising a variable frequency oscillator the frequency of which is changed to effect channel or frequency tuning of said receiver and a frequency synthesis control system in accordance with the present invention.

An exemplary embodiment of the invention will now be described, reference being made to the accompanying drawings, in which.

The frequency control system to be described for use in a television receiver makes use of a digital synthesis principle in which a voltage controlled oscillator (VCO), normally in the form of a varactor diode tuned oscillator, is provided as the local oscillator of the television receiver, the frequency of the VCO, after frequency division, being compared with a reference frequency derived from a crystal controlled oscillator again via frequency division, an error signal being derived which is dependent upon the difference between the two compared frequencies, the error signal being applied to the VCO for controlling its frequency. The system acts as a closed feedback loop and the frequency of the VCO is changed so as to maintain the two compared frequencies the same. By changing the division ratio of the frequency divider acting on the output of the VCO, or possibly on the reference oscillator, the frequency of the VCO can be changed to effect frequency tuning i.e. channel selection of the television receiver with which it is associated.

Figure 1:
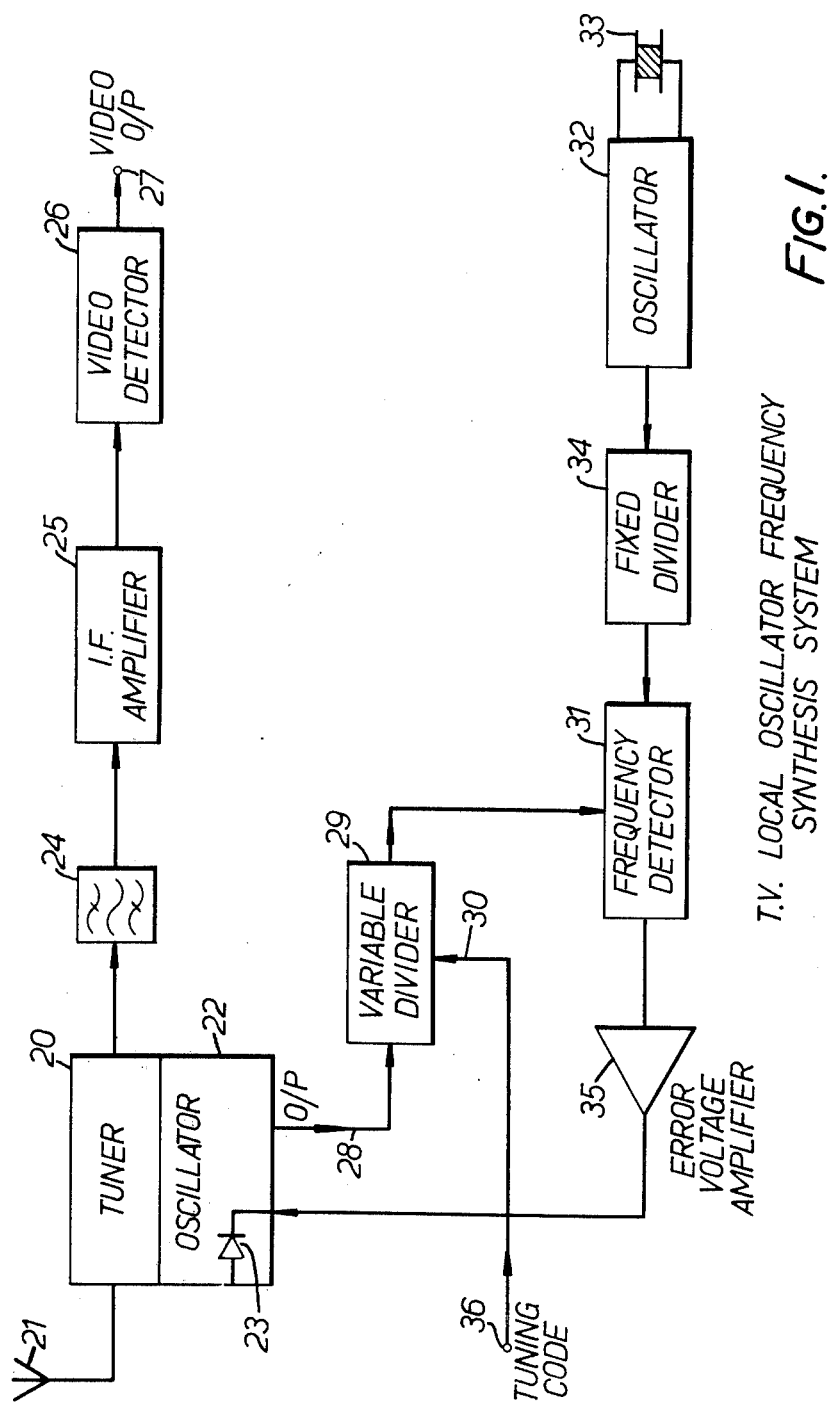
FIG. 1, is a block schematic diagram of a digital synthesis frequency control system for use in a television receiver according to the present invention.

In FIG. 1 of the drawings, there is shown a frequency control system of this form applied to a television receiver. Only part of the television receiver proper is shown, these parts being a tuner 20 fed from an aerial 21, and a voltage controlled local oscillator 22 the frequency of which is controlled by means of a varactor diode arrangement shown schematically at 23, the output of the tuner 20 being fed to a band-pass filter 24 and thence to an I.F. (intermediate frequency) amplifier 25 and a video detector 26 which affords the usual video output 27.

Frequency selection and control of the oscillator 22 and thus channel selection of the tuner 20 is achieved by feeding an output 28 from the oscillator 22 to a variable divider 29, the division ratio of which is variable over a predetermined range in dependence upon a control input 30 applied thereto. The output from the variable divider 29 is applied as one input to a frequency detector 31 which derives a second input from a reference oscillator 32 which operates under the control of a crystal 33 via a fixed divider 34. The output from the frequency detector 31 is applied to an error voltage amplifier 35 the output from which is applied to the varactor diode arrangement 23 of the oscillator 22. The arrangement operates as a closed feedback loop, the frequency of the oscillator 22 being set dependent upon the division ratio of the variable divider 29. The division ratio of the variable divider 29 may be set to correspond to each of the required channels by applying suitable tuning code information to the control input 30 thereof via tuning code input 36.

In this arrangement, the frequency stability is dependent entirely on the stability of the crystal oscillator 33 and the arrangement is advantageous over the known forms of AFC system in that:

(a) Very accurate tuning without any setting up is obtained. Once the frequency or channel code has been set into the variable divider, the accuracy is only dependent upon the accuracy of the oscillator crystal. The requirements of accuracy do not impose very heavily on crystal design and the crystal should not be as expensive as the normal colour crystal used in present day television receivers.

(b) The frequency control is totally independent of signal strength. This is because no input signal is required for the system to operate. The local oscillator is set to the required frequency without the assistance of the incoming signal.

(c) Capture by strong adjacent channels is impossible. This is because the frequency control is entirely independent of the incoming signal. (d) Channel identification is easily obtained. The channel code is unique and an indication of the station being received is easily established from the variable divider. In a preferred arrangement the code may be in decimal form and the station selected by selecting its own number. The code can be individually hand wired and then connected through an existing touch pad or push button system or a simple two-digit decimal switch can be used for each channel giving access to all stations.

(e) Considerable simplification of the television touch tuning system is achieved. In a conventional television touch tuning system, each touch pad is provided with a latch which acts as a memory to operate two sets of switches. One set of switches provides power to light a channel indicator lamp and to provide power to the VHF and UHF tuners. A second set of switches which have to operate at higher voltages pass the accurate voltages required for tuning the VFO varactor diode. This second set of switches whilst having to have the capability of handling typically 33 volts have also to have low 'ON' voltage and a very low temperature drift characteristic if the frequency accuracy is to be maintained. By using the frequency control system of the present invention this second set of switches may be completely dispensed with so that the touch tuning system may be simplified to that shown in FIG. 2 of the drawings.

Figure 2:
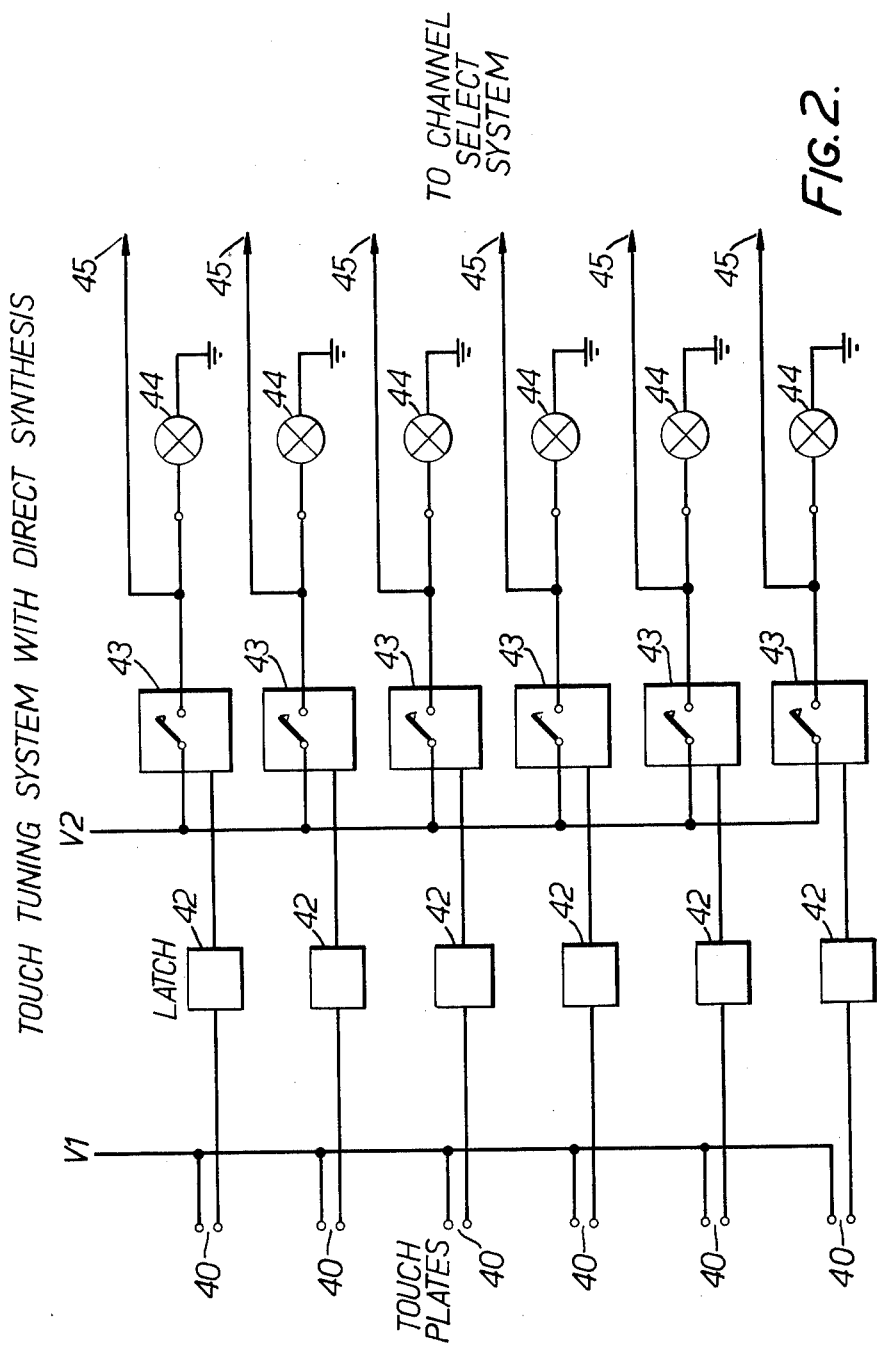
FIG. 2, is a block schematic diagram of a touch tuning arrangement for use in the digital synthesis frequency control system of FIG. 1.

In the arrangement of FIG. 2, six pairs of touch plates 40 are shown, each pair corresponding to a required channel. Each pair of touch plates 40 is effective, when caused to be operated by the close proximity of say a finger to them, for causing a supply voltage $V_1$ to be applied to a corresponding one of six latches 42. Each of the latches 42, when operated, is arranged to cause a corresponding one of six switches 43 to be closed to connect a second supply voltage $V_2$ to a corresponding one of six indicator lamps 44 and to a corresponding output 45 which is applied to the channel select system as will be described hereinafter in connection with the embodiment of FIG. 3. In a typical arrangement sixteen touch-plates 40 may be provided for selecting any one of sixteen corresponding outputs 45.

Turning now to the embodiment of FIG. 3, this depicts a frequency control system based on that described with reference to FIG. 1 of the drawings but which has been modified to make it suitable for use in a so-called European type television receiver. In the following table there is set out the channel frequency and local oscillator (L.O.) frequency for the various channels that are currently in use in Europe.

| Channel No. | Channel Frequency | L. O. Frequency |
|---|---|---|
| 2(K2) | 48.25 | 87.15 |
| 3(K3) | 55.25 | 94.15 |
| 4(K4) | 62.25 | 101.15 |
| 5(K5) | 175.25 | 214.15 |
| 6(K6) | 182.25 | 221.15 |
| . | . | . |
| . | . | . |
| . | . | . |
| 11(K11) | 217.25 | 256.15 |
| 12(K12) | 224.25 | 263.15 |
| 21 | 471.25 | 510.15 |
| 22 | 479.25 | 518.15 |
| . | . | . |
| . | . | . |
| 50 | 703.25 | 742.15 |
| . | . | . |
| . | . | . |
| 67 | 839.25 | 878.15 |
| 68 | 847.25 | 886.15 |
| 69 | 855.25 | 894.15 |
| 70(A) | 53.75 | 92.65 |
| 71(B) | 62.25 | 101.15 |
| 72(C) | 82.25 | 121.15 |
| 73(D) | 175.25 | 214.15 |
| 74(E) | 183.75 | 222.65 |
| 75(F) | 192.25 | 231.15 |
| 76(G) | 201.25 | 240.15 |
| 77(H) | 210.25 | 249.15 |
| 78(J) | 217.25 | 256.15 |
| 79(L) | 224.25 | 263.15 |

Of these channels 2 to 4 constitute VHF Band I channels; channels 5 to 12 constitute VHF Band III channels; channels 21 to 69 constitute the UHF channels and channels 70 to 79 constitute the Italian VHF channels.

From the above it is evident that the channel separation in the UHF Band is 8MHz and that in the VHF Bands is 7MHz and also that the UHF channels and the VHF odd channels have odd integers in MHz whereas the VHF even channels have even integers in MHz. The VCO or L.O. frequency is equal to the sum of the channel frequency and the I.F. frequency of 38.9MHz.

Figure 3:
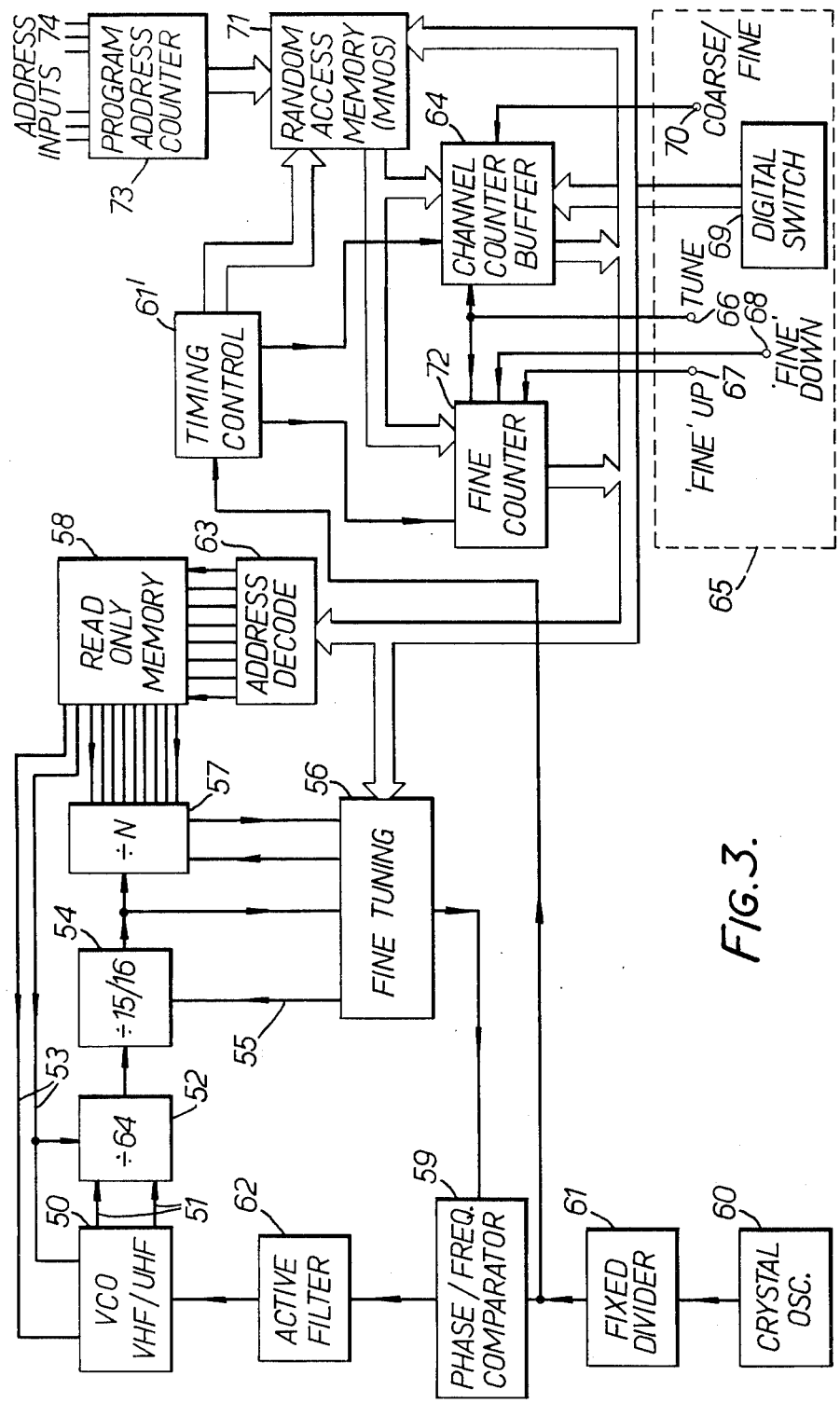
FIG. 3, is a block schematic diagram of a practical implementation of the digital synthesis frequency control system of FIG. 1.

The object of the frequency control system to be described with reference to FIG. 3 is to generate the required VCO frequencies of the television receiver to a very great accuracy so that the receiver can satisfactorily receive all the channels.

Considering now the block diagram shown in FIG. 3 of the drawings, this consists of a combined VHF/UHF VCO 50 which affords respective VHF and UHF outputs via outputs 51 to a fixed divider 52 having a division ratio of ÷ 64. Selection of one or other of the outputs 51 is effected under the control of two control inputs 53 applied to the VCO 50 and operation of the divider 52 on one or other of the outputs 51 is controlled by one of the control inputs 53 which is applied to it. The output from the fixed divider 52 is applied to a further divider 54, the division ratio of which may be set to ÷ 15 or ÷ 16 under the control of a control input 55 applied to it from a fine tuning circuit 56, the operation of which will be considered in detail with reference to FIG. 4 of the accompanying drawings. The output from the ÷ 15/16 divider 54 is applied to the fine tuning circuit 56 and to a variable frequency divider 57, typically in the form of a down counter, the division ratio N of which is controlled by means of a read only memory (ROM) 58 which also generates the control inputs 53 to the VCO 50. The output from the variable divider 57 is applied, via the fine tuning circuit 56 as will be explained later, as one input to a phase/frequency comparator 59 a second input to which is derived from a crystal oscillator 60 via a further fixed divider 61. The output from the phase/frequency comparator 59 is applied to an active filter 62 which integrates, smooths and amplifiers it to afford a control input to the VCO 50.

The read only memory (ROM) 58 is arranged to store information regarding the division ratio required of the variable divider 57 for each of the 68 possible channels. Selection between the channels in the ROM 58 is effected by an address decode circuit 63 under the control of a channel counter/buffer 64 which is itself controlled from either manual input controls 65 which include a 'TUNE' button 66, 'FINE UP' button 67, a 'FINE DOWN' button 68, a digital switch 69 and an optional coarse/fine button 70, or from channel tuning information stored in a random access memory (RAM) which is preferably of non-volatile form, e.g. CMOS form. Similarly operation of the fine tuning circuit 56 is effected by a 'fine' counter 72 which is itself controlled from either the manual input controls 65 or from fine tuning information stored in the RAM 71. The RAM 71 is arranged to store information relating to the settings of the channel counter/buffer 64 and the 'Fine' counter 72 for each of sixteen selectable programs which may be selected by means of a program address counter 73 to which address inputs 74 are applied from, for example, a touch tuning arrangement (not shown) as hereinbefore described with reference to FIG. 2 of the accompanying drawings, or from a remote control unit (not shown) of conventional form which may typically afford 5-bit binary coded outputs or may be of the serial impulse type which delivers step and reset outputs. The 'fine' counter 72, the channel counter/buffer 64 and the RAM 71 are each fed with timing information derived from a timing control 61' which is fed from the fixed divider 61.

Operation of the circuit arrangement of FIG. 3 may best be understood by considering some typical operating sequences. Let it be assumed that program number one of sixteen possible programs is selected by means of a touch control unit or a remote control which applies the appropriate input to the program address counter 73. Let is also be assumed that, say, channel 50 is required to be selected. The number 50 is therefore set into the digital switch 69 and the 'TUNE' button 66 is pressed which causes the channel counter/buffer 64 to be actuated until it reaches a condition corresponding to channel 50. The setting of the channel counter/buffer is then fed into the RAM 71 to a position allocated to program one in which it is stored and is also applied to the address decode circuit 63 which causes the read only memory 58 to set the division ratio N of the variable divider 57 to the division ratio that corresponds to channel 50 as would previously have been stored therein. It may also be arranged that the setting of the channel counter/buffer 64 be displayed on a channel display unit (not shown). The closed feedback loop of the frequency control system then operates until the frequency of the VCO 50 is set to that corresponding to channel 50, thereby causing the television receiver to be set to the required channel. If, after having been so set, it is found that some fine tuning is necessary the 'FINE UP' or 'FINE DOWN' buttons are pressed which causes the 'FINE' counter 7 to be actuated which in turn acts on the fine tuning circuit 56 to slightly change the frequency of two VCO 50 until the required fine tuning is obtained. The setting of the 'FINE' counter 72 is then also stored in the RAM 71 when the FINE UP/-DOWN buttons are released. Subsequent selection of program one without operation of the 'TUNE' button 68 will automatically cause the television receiver to be set to channel 50 in accordance with the information stored in the RAM 71.

The above described arrangement is satisfactory if the channel numbers of the available television transmitters in an area are known but often this is not the case in which event the arrangement may be modified by arranging that the 'FINE UP' and 'FINE DOWN' buttons operate as 'UP' and 'DOWN' buttons on both the 'FINE' counter 72 and the channel counter/buffer 64 and by arranging that the 'TUNE' button is changed to a CHANNEL TUNE/FINE button. Optionally the coarse/fine button 70 may be provided which is quiescently in its 'COARSE' position but may be pressed into the 'FINE' position or vice versa. In this event, the CHANNEL TUNE/FINE button would be set to 'CHANNEL TUNE' and the 'UP' or 'DOWN' button would be selected which would cause the channel counter/buffer to step 'upwards' or 'downwards' sequentially through each of its settings, each of these corresponding to a particular channel. When a required channel is obtained the 'UP' or 'DOWN' button is released and the CHANNEL TUNE/FINE button is set to 'FINE' and the 'UP' and 'DOWN' button used to effect fine tuning as before. Again, the settings of the channel counter/buffer 64 and the 'FINE' counter 72 are stored in the RAM 71 at a position allocated to the selected program number and subsequent selection of that program numbers will cause the television receiver to be returned to the pre-selected channel.

The coarse/fine button 70 may be used to initially cause the channels to be scanned sequentially at a fast rate and when in the vicinity of the channel required, cause the chanels to be scanned at a slow rate to enable the required channel to be more easily selected.

Figure 4:
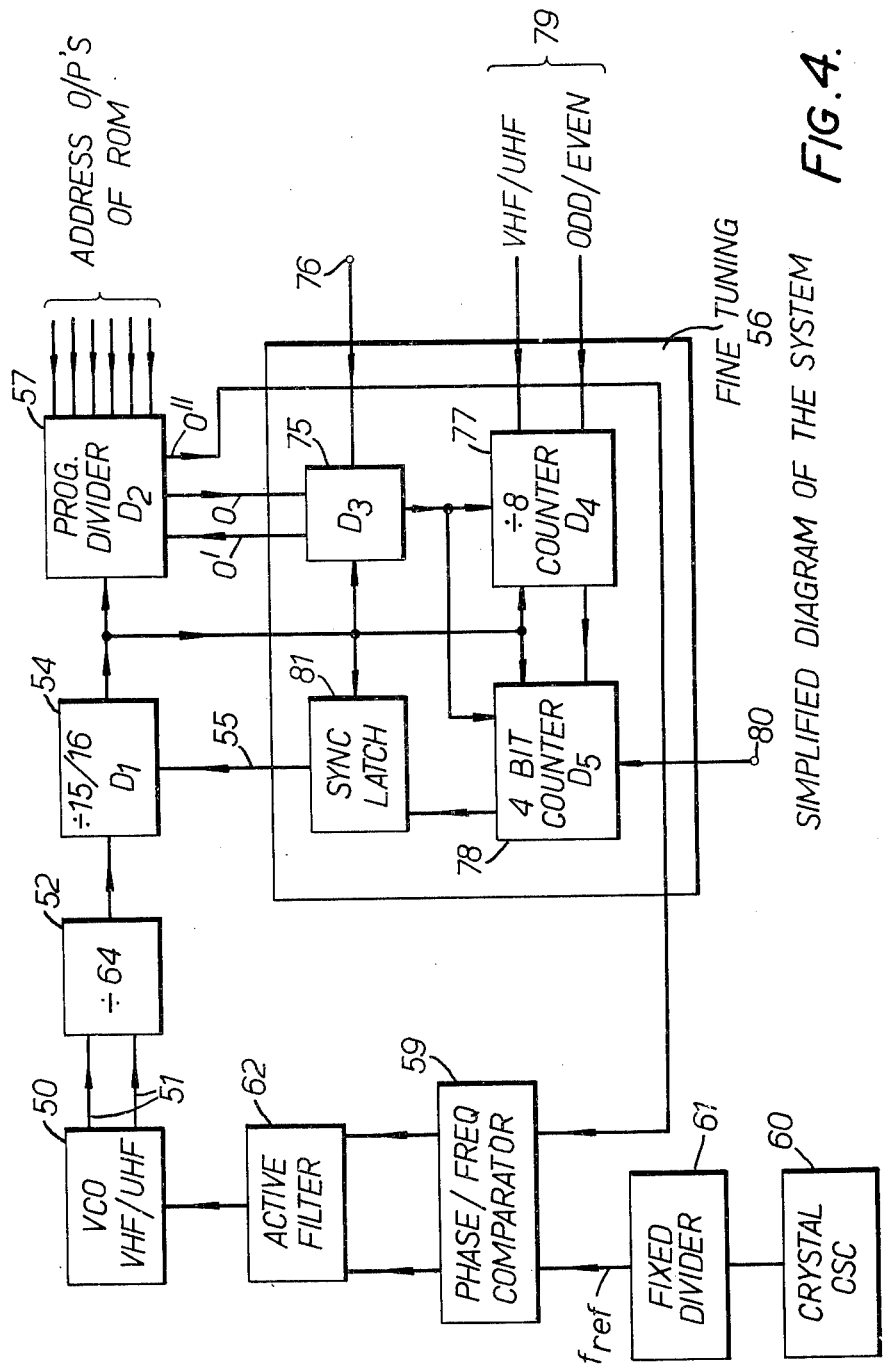
FIG. 4, is a block schematic diagram of the fine tuning circuit of FIG. 2 in greater detail; and, FIG. 5-8 are frequency diagrams illustrating the operation of the fine tuning circuit of FIG. 4.

A detailed description of how frequency tuning or channel selection is effected will now be given, reference being made to FIG. 4 of the accompanying drawings, in association with the frequency diagrams of FIGS. 5 to 8. FIG. 4 depicts parts of the arrangement of FIG. 3, the various parts of which have been accorded the same reference numerals, and also the fine tuning circuit of FIG. 3 in greater detail.

As has been hereinbefore described with reference to FIG. 3, the outputs 51 from the VCO 50 in FIG. 4 are applied to a fixed divider 52 having a division ratio of $\div$ 64, the output of which is applied to a $\div$ 15/16 divider 54, which is normally arranged to have a division ratio of $\div$ 16 but which may be set to have a division ratio of $\div$ 15 by means of the control signal 55 applied to it from the fine tuning circuit 56. It is convenient to refer to this divider as D1. The output of the divider 54 is fed to the programmable variable divider 57 having a division ratio of N, which may conveniently be referred to as D2, an output 0 which is applied to the fine tuning circuit 56.

The output 0 from the programmable variable divider 57, which is afforded when the divider 57 has carried out its count of N, is applied to a 3-stage programmable shift delay 75 (which may also take the form of a two bit counter) which may conveniently be referred to as D3, and which has the capability of adding a maximum of three extra counts to the division ratio N of the variable divider 57 (D2), the number of extra counts being determined by a control input 76 applied to the shift delay 75 from the fine counter 7 (FIG. 3). When the programmable shift delay 75 starts counting, it affords an output 0' to the programmable variable divider 57 which inhibits the input applied to it from the ÷15/16 divider 54. This inhibit is maintained until the shift delay 75 has completed its count at which the inhibit signal afforded over output 0' is removed and the programmable divider 57 affords an output 0" which is applied to the phase/frequency comparator 59 in which it is compared with a reference frequency $f_{ref}$ derived from the crystal controlled oscillator 60 via the fixed divider 61, the output of the comparator 59 being applied, via the active filter 62, to the VCO 50 to control its frequency.

By judicious selection of the various division ratios of the arrangement and by selecting the frequency of the crystal oscillator 60, it may be arranged that for each count of the variable divider 57 (D2) which corresponds to each output of the ÷ 15/16 divider 54 (D1), the frequency of the VCO 50 will change by 2MHz, this being achieved with the ÷ 15/16 divider being set to the division ratio of ÷ 16.

In this way selection of the VHF odd channels and UHF channels may be selected since for each of these channels, the whole number part of the VCO frequency is a even multiple of MHz. However, for VHF even channels, the whole number part of the VCO frequency is an odd multiple of MHz and means must be designed into the circuit to enable the VHF even channels to be selected. In addition it is nearly always required that a manual fine tuning capability be provided to allow for non-precise channel frequencies to be catered for. The VHF even channel selection and manual fine tuning is effected in the arrangement of FIG. 4 by making use of the fact that every count of the variable divider 57, which is effected by an output from the ÷ 15/16 divider 54 when set to a division ratio of ÷ 16 corresponds to a change in VCO frequency of 2MHz. If now, in N counts of the variable divider 57 the division ratio of the ÷ 15/16 divider 54 is set once to ÷ 15 instead of ÷ 16 then it can be shown that the VCO frequency will increase by 125KHz. Similarly, if the division ratio of the ÷ 15/16 divider 54 is set to ÷ 15, eight times in N counts, then the VCO frequency will be increased by 1MHz and if the division ratio is set to ÷ 15 times in N counts, then the VCO frequency will be increased by 1.875MHz.

It is thus arranged that in order to select VHF even channels, the division ratio of the ÷ 15/16 divider 54 is set to ÷ 15 eight times in every N counts of the variable divider 57, thereby enabling the odd multiple VCO frequencies to be selected. In order to provide a fine tuning facility it is arranged that the division ratio of the ÷ 15/16 divider 54 is set to ÷ 15 a further fifteen times in each sequence of N counts of the variable divider 57, thus affording a frequency change of 1.875 MHz, the additional counts of ÷ 15 being reduced sequentially from fifteen to zero in say ⅛ second time intervals, in order to obtain the required fine frequency change.

This is achieved in the arrangement of FIG. 4, by providing a preset ÷ 8 counter 77 which may be referred to as D4 and a 4-bit down counter 78 which may be referred to as D5 both of which are enabled by an output from the shift delay 75 and both of which are clocked by the output from the ÷ 15/16 divider 54. The ÷ 8 counter 77 is operated in accordance with VHF/UHF and ODD/EVEN control signals 79 applied to it from the channel counter/buffer 64 (FIG. 3) so that when VHF even channels are selected, the = 8 counter 77 and the 4-bit down counter 78 are connected in series, the ÷ 8 counter 77 counting first and when UHF and odd VHF channels are selected the ÷ 8 counter 77 is effectively by-passed so that only the 4-bit down counter 78 counts. The count of the 4-bit down counter may be set by means of a control input 80 applied to it from the fine counter 72 (FIG. 3) and its output is applied via a synchronising latch 81 to the control input 55 of the ÷ 15/16 divider 54 to control its division ratio.

The precise operation of the circuit arrangement of FIG. 4 may best be explained by considering a number of examples in which the VCO 50 is required to be set in accordance with a required channel number.

The frequency $f_{vco}$ of the VCO 50 can be calculated from the equation:

$$f_{vco} = 64 \cdot f_{ref}[16(\overline{N + x} - A) + A.15] \quad (1)$$

where, for UHF and odd VHF channels $$N = \left[\frac{\text{Channel VCO Frequency in MHz}}{2}\right] - 1 \quad (2)$$

and for even VHF channels $$N = \frac{\text{Channel VCO Frequency in MHz} - 1}{2} \quad (3)$$

and where $x$ = Division count of shift delay $D_3$. This could be any number between 0 and 3 both inclusive. A = Total division count of $D_4$ and $D_5$. This could be any number between 15 and 0, both inclusive, for UHF and odd VHF channels, any number between 23 and 8, both inclusive for even VHF channels. $f_{ref}$ = 1.953 KHz Equation 1 has been derived from the fact that $D_1$ initially divides by 15 A times during the total division count of $D_2$ and $D_3$ which equals (N + x), and that $D_1$ divides by 16 the rest of the times, (N + x − A). For a fixed value of N and x, as A changes, so does $f_{vco}$. The increment $\Delta f_{vco}$, which is the fine tuning step, can be calculated from equation 1 as follows:
$\Delta f_{vco} = 64 f_{ref} = 125$ KHz.

The ROM 58 (FIG. 3) has BCD coded inputs for channel numbers. Its binary outputs operate the programmable variable divider, 58, to provide the required division ratio, N.

Method of UHF and odd VHF Channel Selection

Let it be assumed that channel 50 is required to be selected, this lying in the UHF band and requiring a VCO frequency of 742.15 MHz. The requirements of operation are as follows:

1. When 'TUNE' 68 (FIG. 3) is operated after setting the channel number in the digital switch 69 (FIG. 3), the frequency should be very close to 742.15MHz.

2. When fine tune UP 67 or DOWN 68 (FIG. 3) is operated, the fine tuning range should be ± 4MHz around the centre frequency of 742.15MHz in steps of 125KHz at a rate of say ⅛ sec per step.

The value of N can be calculated from equation 2 as follows;

$N = (742/2) - 1 = 370$

"TUNE" Operation

When 'TUNE' 68 (FIG. 3) is operated after setting '50' in the digital switch 69 (FIG. 3) the functions of the different stages of the system are as follows:
1. $D_2$ divides by N = 370
2. $D_3$ provides an additional count of 2. Thus $x = 2$
3. (1) $D_5$ is preset to down count from 15
(11) $D_4$ is ineffective
(111) total count of $D_4$ and $D_5$ i.e. A = 15.

Substituting the values of N, x and A in Equation 1 we obtain the value of $f_{vco}$ given below, $$f_{vco} = 742.125 \text{ MHz} \tag{6}$$

Figure 5:
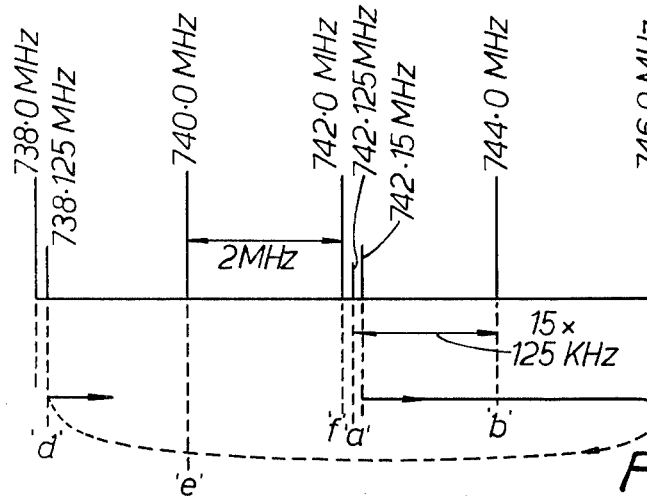

This is indicated in position 'a' in the frequency diagram of FIG. 5. This frequency is in fact 25KHz offset from the required frequency of 742.15 MHz but is acceptable.

Fine 'UP' Tuning

Now, if any fine tuning is necessary to optimise the picture on the T.V. screen, the fine tuning 'UP' control 67 (FIG. 3) is pressed. If the 'UP' control remains pressed, the functions of the various stages involved now are as follows:
1. The presetting data input to $D_5$ changes from 15 to 0 at the rate of 8 steps per second. This changes 'A' in equation 1 correspondingly. Accordingly, this means that $f_{vco}$ is increasing by a step of 125KHz at the rate of 8 steps per second. When A goes to '0', $f_{vco}$ from Equation 1 becomes, $$f_{vco} = 744 \text{ MHz}$$

This is indicated in position 'b' in FIG. 5.
2. When the tuning frequency reaches 'b' in FIG. 6:
 (a) $D_3$ is increased by 1, thus $x = 3$.
 (b) $D_5$ is preset to downcount from 15. Thus A = 15.
 (c) Fine tuning continues as explained in paragraph 1 above, giving the end frequency of vco for A = 0 as;

$$f_{vco} = 746 \text{MHz}$$

This is indicated in position 'c' in FIG. 5.
3. When the tuning frequency reaches 'c' in FIG. 5:
 (a) $D_3$ is set to zero, thus $x = 0$
 (b) $D_5$ is preset to down count from 15, hence, A = 15.
 (c) $f_{vco}$ from Equation 1 now becomes as; $f_{vco}$ = 738.125 MHz - 'd' in FIG. 5,
 (d) Fine tuning continues as before, making $f_{vco}$ for A =0, as;

$$f_{vco} = 740 \text{ MHz}$$

This is indicated in position 'e' in FIG. 5.
4. When the tuning frequency reaches 'e' in FIG. 5:
 (a) $D_3$ is set to 1, thus $x = 1$
 (b) A = 15
 (c) Fine tuning continues as before till the tuning frequency reaches position f in FIG. 5 for $f_{vco}$ = 742MHz and A = 0.

From position 'f' the fine tuning continues and the tuning frequency moves to position 'b' and so on.

The moment the UP control is released, the fine tuning stops, $D_3$ stays at the value of $x$ at that time, and $D_5$ stays at the value of A at that time. These values of $x$ and A are stored in the RAM 71 (FIG. 3).

Fine 'DOWN' Tuning

If the DOWN control 68 (FIG. 3) is pressed after TUNE operation for optimising the picture on the T.V. screen, the functions of the various stages involved, as long as the DOWN control remains pressed, are as follows:
1. $D_3$ is set to 1, thus, $x = 1$ and $D_5$ is preset to 0, thus A = 0. $f_{vco}$ from Equation 1 now becomes as, $$f_{vco} = 742 \text{MHz}$$

Figure 6:
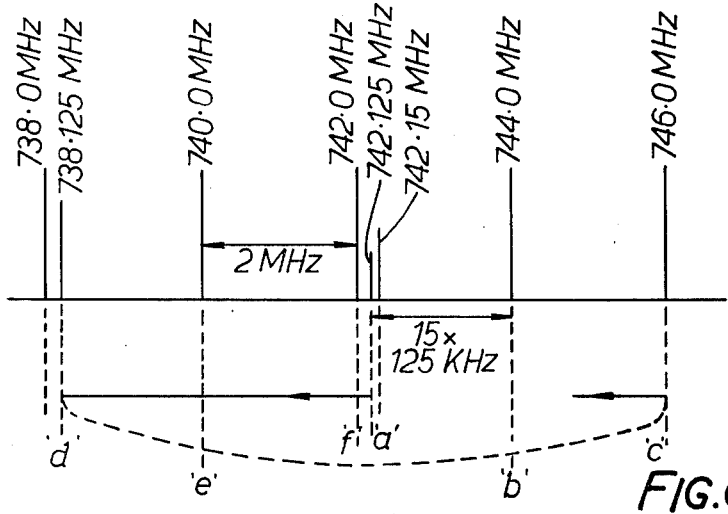

This is indicated in position 'f' in FIG. 6.
2. When the tuning frequency reaches 'f' in FIG. 6:
 (a) The presetting data input to $D_5$ increases from 0 to 15 at the rate of 8 steps per second, increasing the value of A from 0 to 15 at the same rate. This means that $f_{vco}$ is decreasing by a step of 125 KHz at the rate of 8 steps per second. The end value of $f_{vco}$ for A = 15 can be calculated from equation 1, as, $$f_{vco} = 740.125 \text{MHz}$$

(b) When this end is reached,
$D_4$ is set to 0, thus $x = 0$ and $D_5$ is preset to count up from 0, thus A = 0
$f_{vco}$ from Equation 1 can now be written as, $$f_{vco} = 740 \text{ MHz}$$

This is indicated in position 'e' in FIG. 6.
3. Fine tuning continues as before as A increases from 0 to 15.
For $x = 0$ and A = 15, $f_{vco}$ = 738.125 MHz. This is indicated in position 'd' in FIG. 6.
4. (a) When the tuning frequency reaches position 'd' (FIG. 6):
$D_4$ is set to 3, thus $x = 3$ and $D_5$ is preset to count up from 0, thus A = 0, Hence, $f_{vco} = 746$ MHz This is indicated in position 'c' in FIG. 6.
 (b) Fine tuning continues as before as A increases from 0 to 15. The tuning frequency reaches position 'b' in FIG. 7, $D_4$ is set to 3, thus $x = 2$ and $D_5$ is preset to count up from 0, thus A = 0.
 (c) From position 'b' fine tuning continues and reaches position 'a' at which time $D_4$ is set to 1, thus $x = 1$ and $D_5$ is preset to count up from 0, thus, A = 0. The fine 'DOWN' tuning is then repeated.

As in the case of 'UP' fine control, the moment the DOWN control is released, the fine tuning stops, $D_3$ stays at the value of $x$ at that time, and $D_5$ stays at the value of A at that time. These values of $x$ and A are stored in the RAM 71 (FIG. 3).

Method of Frequency Tuning for even VHF Channels

In order to explain the method of frequency tuning for even VHF channels, let us take channel '6' as an example. The corresponding VCO frequency is 221.15MHz. The value of N can be calculated from equation 3 as follows:

$$N = 221 - 1/2 = 110$$

Tune Operation

When 'TUNE' 68 (FIG. 3) is operated after setting '6' in the digital switch 69, (FIG. 3), the functions of the different stages of the system are as follows:
1. $D_2$ divides by N = 110
2. $D_3$ provides an additional count of 2. Thus $x = 2$.
3. (1) $D_5$ is preset to down count from 15. (11) $D_4$ is preset to down count from 8. (111) Total count of $D_4$ and $D_5$ i.e. A = 23.

Substituting the value of N, $x$ and A in Equation 1, we obtain the value of $f_{vco}$:

$$f_{vco} = 221.125 \text{MHz}$$

This frequency is offset by 25KHz from the required frequency of 221.15MHz but is acceptable.

The operation of the 'Fine UP' tuning and 'Fine DOWN' tuning is similar to that described above for UHF and odd VHF channel selection except that in both cases counter $D_4$ is set to count down from 8.

Figure 7:
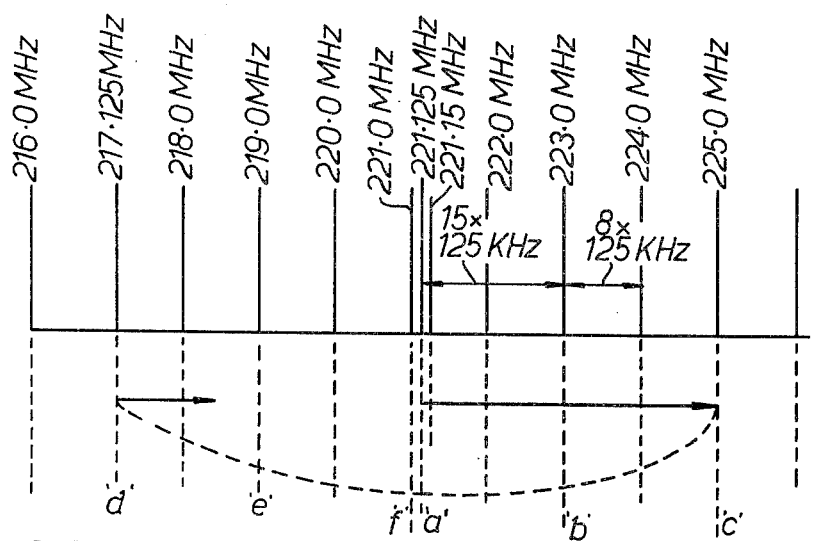
Figure 8:
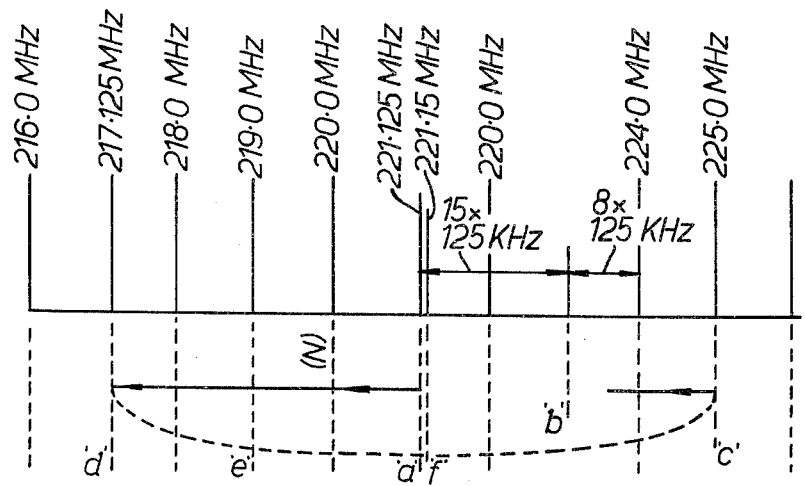

This results in a 'Fine UP' frequency diagram as shown in FIG. 7 and a 'Fine DOWN' frequency diagram as shown in FIG. 8.

It is especially envisaged that the digital synthesis frequency control system of FIG. 3 be implemented in integrated circuit form in which case it is envisaged that the following integrated circuit packages be used:

$IC_1$ - A bipolar, 14 pin dual-in-line (DIL) package incorporating the ÷ 64 divider 52.

$IC_2$ - A bipolar, 14 pin DIL package incorporating the - 15/16 divider 54, the phase/frequency comparator 59, part of the fixed divider 61 and the crystal oscillator 60.

$IC_3$ - A MOS, 16 pin DIL package incorporating the programmable variable divider 57, the ROM 58 and fine tuning circuit 56, part of the fixed divider 61.

$IC_4$ - A MNOS, 24 pin DIL package incorporating the RAM 71, the program address counter 73, the fine counter 72 and the channel counter/buffer 64.

$IC_5$ (optional) incorporating the active filter 62, and band supply switching circuit for the tuner.

In the arrangement of FIG. 3, in order to facilitate programming of the ROM 58 and the RAM 71 with the minimum number of interconnecting lines, conventional multiplexing techniques may be used and additionally the RAM 71 may be arranged to operate in accordance with a read/erase/write cycle which is generated whenever a change in program number is detected or when the 'TUNE' or FINE UP/DOWN controls are operated.

Conveniently also, it may be arranged that a 'MUTE' output be generated which operates when a channel is changed to block the T.V. sound for a period say, of 200mS.

Although described as being applied to television receivers, the frequency synthesis tuning system described may have application in other forms of communications equipment such as radio receivers, radio transmitters, transmitter/receivers etc., and although 'channel' tuning has been extensively considered, in other applications, simple frequency tuning may be used.

What we claim is:

1. A frequency synthesis control system for communications equipment including a variable frequency oscillator the frequency of which is changed to effect channel or frequency tuning of said equipment, the control system comprising, first divider means for dividing the output of the variable frequency oscillator by a first division ratio or a second division ratio under the control of a fine tune control signal applied to said first divider means, the output of said first divider means being a first divided signal, variable frequency divider means for dividing said first divided signal, the division ratio of which is selected in accordance with a required channel or frequency of said equipment, the output of said variable divider means being a second divided signal, reference frequency generator means for generating a reference frequency signal, and comparator means for comparing the second divided signal and the reference frequency signal and for producing a control signal which is fed to the variable frequency oscillator for controlling its frequency, fine tuning means being provided for applying the fine tuning control signal to the first divider means and for applying a further fine tuning control signal to the variable frequency divider means whereby the division ratios of both divider means are changed for effecting fine tuning of the variable frequency oscillator.

2. A system as claimed in claim 1, in which the variable frequency divider means includes first programmable divider means, memory means being provided for selecting a division ratio of the first programmable divider means that corresponds to a required channel or frequency of said equipment.

3. A system as claimed in claim 2, in which the memory means takes the form of a read only memory.

4. A system as claimed in claim 2, in which the variable frequency divider means includes a further programmable divider means operable in conjunction with the first programmable divider means and to which the further fine tuning control signal from the fine tuning means is applied for controlling its operation.

5. A system as claimed in claim 4, in which the further programmable divider means takes the form of multi-bit shift delay means.

6. A system as claimed in claim 4, in which the further programmable divider means takes the form of multi-bit counter means.

7. A system as claimed in claim 1, in which the comparator means takes the form of a phase/frequency comparator.

8. A system as claimed in claim 7, in which the variable frequency oscillator is voltage controlled, the phase/frequency comparator providing a control voltage to the variable frequency oscillator for controlling its frequency.

9. A system as claimed in claim 8, in which the voltage controlled variable frequency oscillator includes at least one varactor diode to which the control voltage is applied.

10. A system as claimed in claim 1, in which the first divider means includes prescaler divider means for dividing the output of the variable frequency oscillator and dual modulus divider means for dividing the output of the prescaler divider means to produce the first divided signal.

11. A system as claimed in claim 7, in which the fine tuning means includes counter means being responsive to the output of the further programmable divider means for providing a fine tuning control signal to the first divider means for changing the division ratio of said first divider means.

12. A system as claimed in claim 11, in which the counter means comprises a fixed counter operable under the control of a control signal applied to it and a variable counter operable under the control of a control signal applied to it, the fixed counter and the variable counter being connected effectively in series.

13. A system as claimed in claim 12, in which the output of the variable counter is applied to the first divider means via synchronising latch means operable in conjunction with the output of the first divider means.

14. A system as claimed in claim 13, wherein the frequency of said variable frequency oscillator is changed to effect channel tuning of said equipment, the system further comprising channel counter means operable in conjunction with the memory means for selecting a division ratio of the first programmable divider means in accordance with a required channel of said equipment.

15. A system as claimed in claim 14, comprising channel select means connected to the channel counter means for selecting the required channel.

16. A system as claimed in claim 15, in which the channel select means takes the form of a digital switch.

17. A system as claimed in claim 15, comprising fine counter means for providing the control signal to the variable counter.

18. A system as claimed in claim 15, in which the channel select means and the fine counter means operate in conjunction with the timing control means under the control of a 'tune' signal applied thereto.

19. A system as claimed in claim 18, in which the tuning control means derives an input thereto from the reference frequency generator means.

20. A system as claimed in claim 19, in which the channel counter means is provided with control means for changing the counting rate of the channel counter means.

21. A system as claimed in claim 20, in which the control means is effective for providing a coarse/fine control.

22. A system as claimed in claim 17, in which the fine counter means takes the form of an up/down counter which is provided with control inputs for causing the counter means to count up or count down.

23. A system as claimed in claim 17, comprising further memory means for storing information relating to the count positions of the channel counter means and the fine counter means corresponding to a required channel.

24. A system as claimed in claim 23, in which the further memory means is of non-volatile form.

25. A system as claimed in claim 24, in which the further memory means takes the form of a metal-nitride-oxide-semiconductor (MNOS) memory.

26. A system as claimed in claim 24, in which the further memory means takes the form of a complementary metal-oxide-semiconductor (CMOS) memory.

27. A system as claimed in claim 23, further comprising program select means operable in conjunction with the further memory means for causing the channel counter means and the fine counter means to be set in accordance with a preselected channel.

28. A system as claimed in claim 27, in which the program select means enables one of a plurality of programs, each corresponding to a preselected channel to be selected, the further memory means being arranged to store information relating to the count positions of the channel counter means and the fine counter means for the preselected channels corresponding to the plurality of programs.

29. A system as claimed in claim 27, in which the program select means comprises a program address counter for causing the information stored in the further memory means relating to the count positions of the channel counter means to be applied to the channel counter means, and for causing the information stored in the further memory means relating to the counter positions of the fine counter means to be applied to the fine counter means.

30. A system as claimed in claim 29, in which the program select means comprises a touch tuning arangement for effecting program selection.

31. A system as claimed in claim 30, in which the touch tuning arrangement comprises a pair of touch plates for each of the programs to be selected, and latch means associated with each pair of touch plates which is caused to be operated when the pair of touch plates with which it is associated are activated, each of the latch means being effective for causing a common voltage to be applied to the program address counter to cause the information relating to a preselected channel and corresponding to a required program, stored in the further memory means to be applied to the channel counter means and the fine counter means respectively.

32. A system as claimed in claim 31, in which the touch tuning arrangement comprises indicator means for indicating which program has been selected.

* * * * *